United States Patent
Adam et al.

(10) Patent No.: US 9,087,859 B2
(45) Date of Patent: Jul. 21, 2015

(54) FINFET WITH ENHANCED EMBEDDED STRESSOR

(71) Applicant: INTERNATIONAL BUSINESS MACHINES CORPORATION, Armonk, NY (US)

(72) Inventors: Thomas N. Adam, Slingerlands, NY (US); Kangguo Cheng, Schenectady, NY (US); Ali Khakifirooz, Mountain View, CA (US); Alexander Reznicek, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/457,273

(22) Filed: Aug. 12, 2014

(65) Prior Publication Data

US 2014/0357037 A1 Dec. 4, 2014

Related U.S. Application Data

(62) Division of application No. 13/457,529, filed on Apr. 27, 2012, now Pat. No. 8,853,750.

(51) Int. Cl.
*H01L 29/66* (2006.01)
*H01L 21/8234* (2006.01)
*H01L 21/8238* (2006.01)
*H01L 21/265* (2006.01)
*H01L 29/36* (2006.01)
*H01L 29/78* (2006.01)

(52) U.S. Cl.
CPC .... *H01L 29/66795* (2013.01); *H01L 21/26506* (2013.01); *H01L 21/823412* (2013.01); *H01L 21/823431* (2013.01); *H01L 21/823807* (2013.01); *H01L 21/823821* (2013.01); *H01L 29/36* (2013.01); *H01L 29/7851* (2013.01)

(58) Field of Classification Search
CPC ................. H01L 29/66795; H01L 21/823431; H01L 21/823821; H01L 29/785; H01L 29/7845
See application file for complete search history.

(56) References Cited

U.S. PATENT DOCUMENTS

| 6,107,653 A | 8/2000 | Fitzgerald |
| 7,198,995 B2 | 4/2007 | Chidambarrao et al. |

(Continued)

OTHER PUBLICATIONS

M. Mendez wt sl., "Comparing SOI and Bulk FinFETs: Performance, Manufacturing Variability, and Cost," Solid State Technology, vol. 52, No. 11, Nov. 2009, pp. 10, 12-15.

*Primary Examiner* — Tucker Wright
(74) *Attorney, Agent, or Firm* — Cantor Colburn LLP; Joseph Petrokaltis

(57) ABSTRACT

A channel region of a finFET has fins having apexes in a first direction parallel to a surface of a substrate, each fin extending downwardly from the apex, with a gate overlying the apexes and between adjacent fins. A semiconductor stressor region extends in at least the first direction away from the fins to apply a stress to the channel region. Source and drain regions of the finFET can be separated from one another by the channel region, with the source and/or drain at least partly in the semiconductor stressor region. The stressor region includes a first semiconductor region and a second semiconductor region overlying and extending from the first semiconductor region. The second semiconductor region can be more doped than the first semiconductor region, and the first and second semiconductor regions can have opposite conductivity types where a portion of the second semiconductor region meets the first semiconductor region.

18 Claims, 10 Drawing Sheets

(56) References Cited

U.S. PATENT DOCUMENTS

| | | |
|---|---|---|
| 7,335,544 B2 | 2/2008 | Chen et al. |
| 7,335,545 B2 | 2/2008 | Currie |
| 7,393,733 B2 | 7/2008 | Currie |
| 7,618,866 B2 | 11/2009 | Luo et al. |
| 7,863,122 B2 | 1/2011 | Booth, Jr. et al. |
| 7,968,960 B2 | 6/2011 | Bhattacharyya et al. |
| 8,022,488 B2 | 9/2011 | Cheng et al. |
| 2008/0197412 A1 | 8/2008 | Zhang et al. |
| 2010/0248454 A1 | 9/2010 | Maszara et al. |
| 2013/0228830 A1 | 9/2013 | Lee et al. |

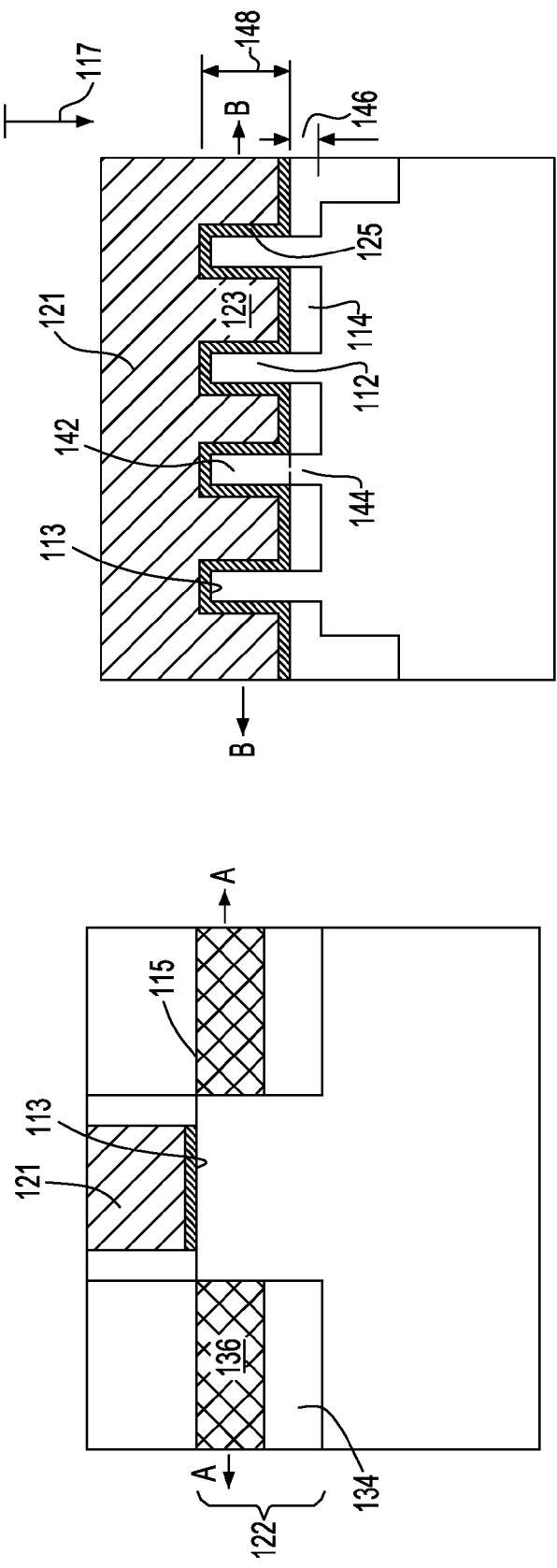
FIG. 3A
FIG. 3B
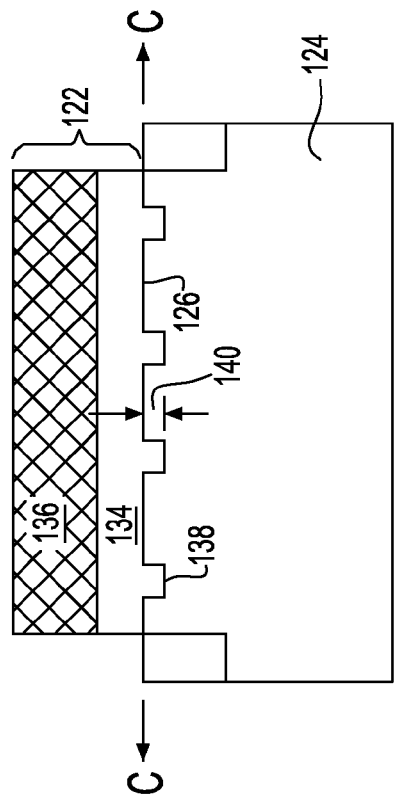
FIG. 3C

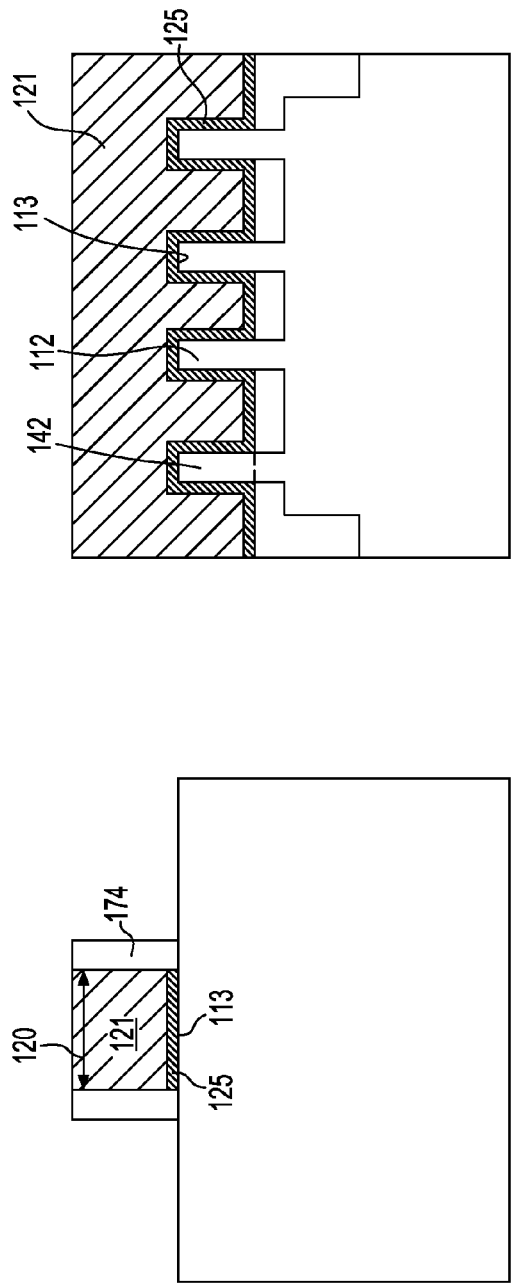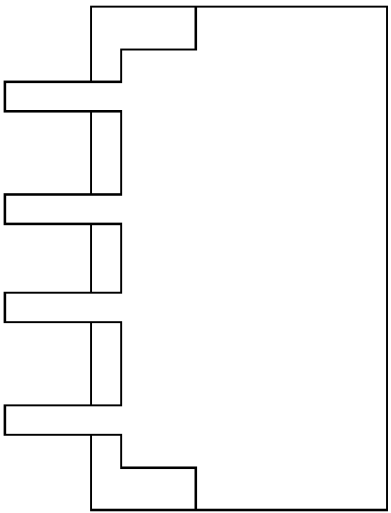

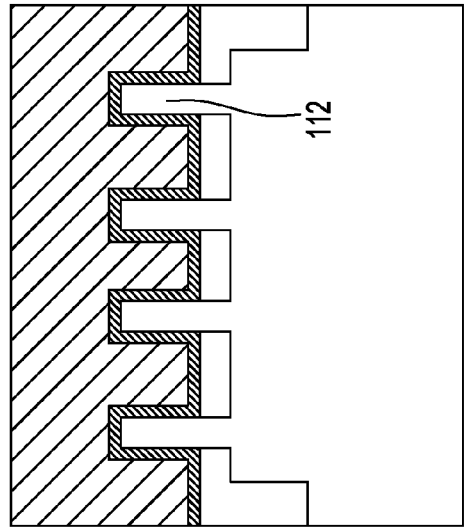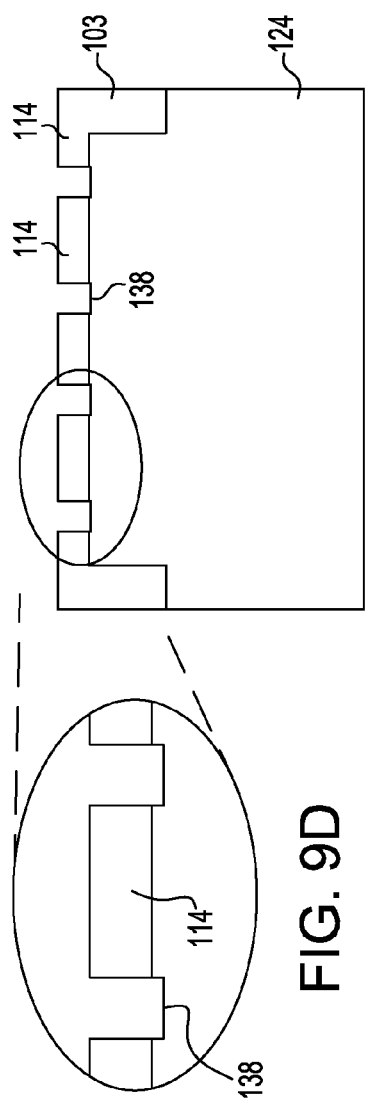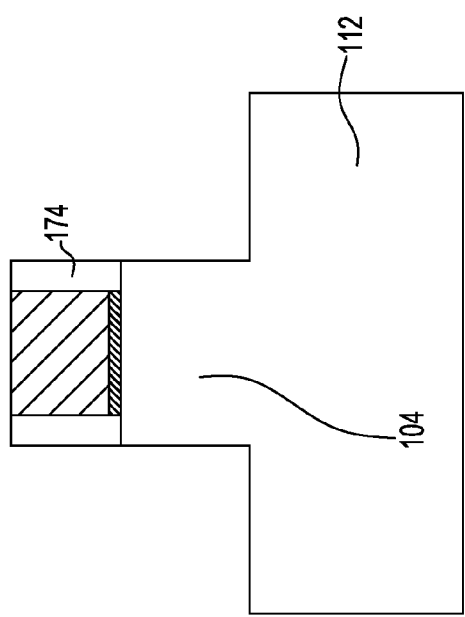

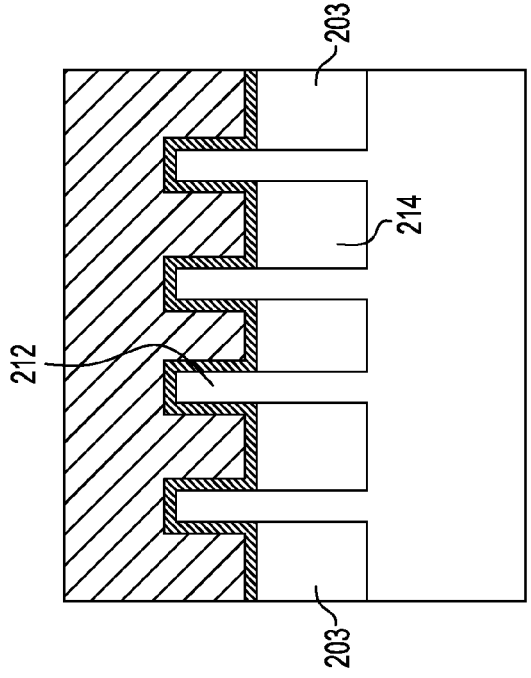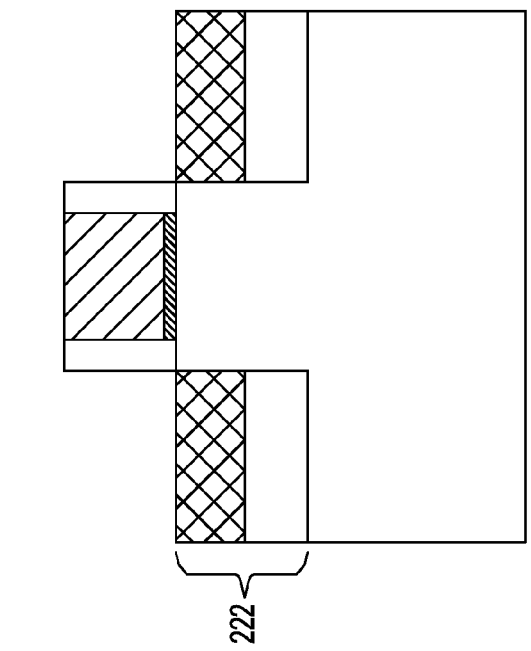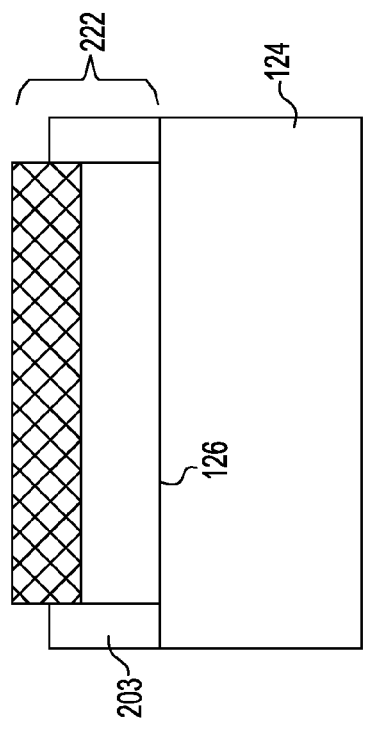

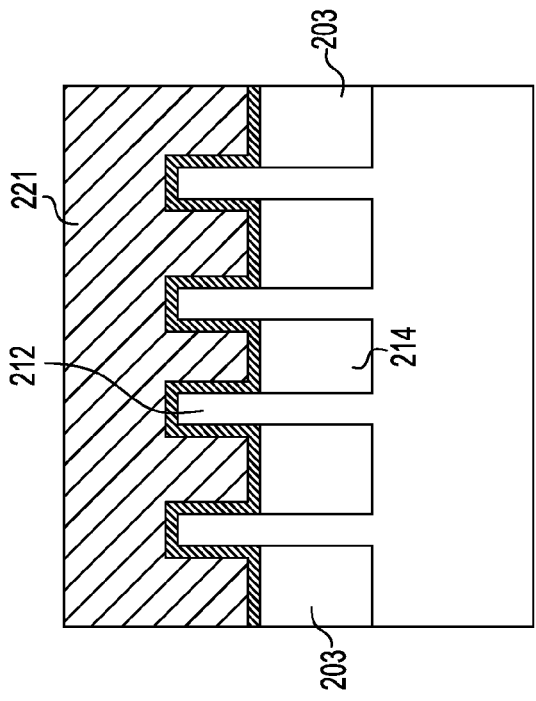
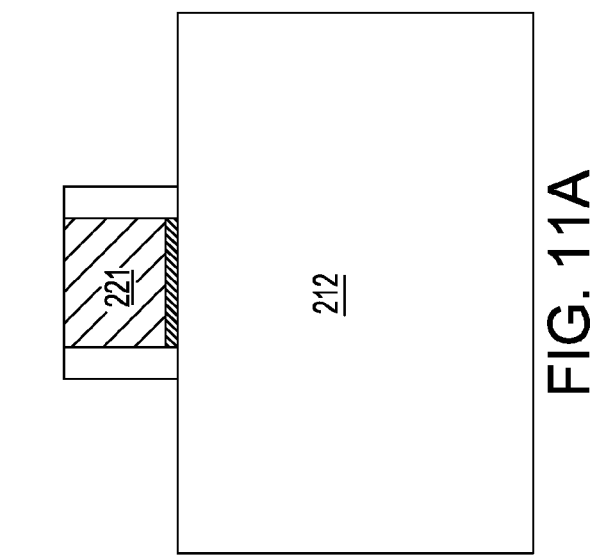
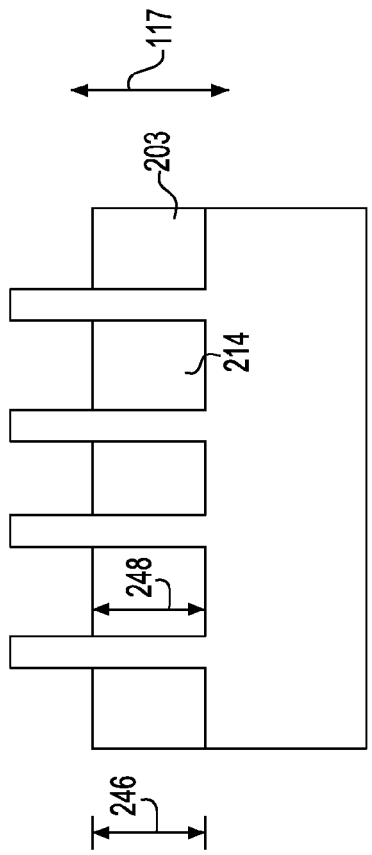

US 9,087,859 B2

FINFET WITH ENHANCED EMBEDDED STRESSOR

DOMESTIC PRIORITY

This application is a divisional of U.S. patent application Ser. No. 13/457,529, filed Apr. 27, 2012, the disclosure of which is incorporated by reference herein in its entirety.

BACKGROUND OF THE INVENTION

1. Field of the Invention

The present invention relates to semiconductor devices and their manufacture, and more specifically to a structure and method of making a field effect transistor (FET) of the finFET type having a channel region with a plurality of parallel fins and a stressor region embedded in at least one of a source or drain region thereof.

2. Description of the Related Art

FinFETs such as shown in FIG. 1 are known which have a channel region with a plurality of parallel fins and a gate overlying the plurality of fins. The fins typically extend in a direction 10 parallel to a major surface of a semiconductor substrate from one peripheral edge 16 of an active semiconductor region to another such peripheral edge 18 opposed thereto. Trench isolation trenches 14 typically extend in the same direction 10 as the fins 12 and extend from the peripheral edge 16 of the active semiconductor region to the other peripheral edge 18 opposed thereto. Such configuration of the fins 12 and isolation trenches 14 extending beyond the channel region can make it difficult to form a semiconductor stressor region in one or more of the source region and drain region of the finFET which are separated from one another by the channel region 104. The presence of the isolation trenches 14 in these areas can decrease the amount of stress that the semiconductor stressor region can apply to the channel region 104. In addition, an effective semiconductor stressor region must be formed without resulting in certain unwanted electrical characteristics such as device punch-through.

Further improvements can be made to the structure and fabrication of finFET devices.

SUMMARY OF THE INVENTION

According to an aspect of the invention, a transistor is provided which can be formed on a substrate. The transistor has a channel region having a plurality of fins. Each fin may have an apex extending in a first direction parallel to a major surface of the substrate, and each fin can extend in a second direction downwardly away from the apex thereof. A gate can overlie the apexes and extend downwardly between adjacent fins of the channel region. A semiconductor stressor region can extend in at least the first direction away from the fins and can be configured to apply a stress to the channel region. The semiconductor stressor region can include a first semiconductor region and a second semiconductor region overlying the first semiconductor region. A source region and a drain region of the transistor can be separated from one another in the first direction by the channel region. At least one of the source region or the drain region can be disposed at least partly within the semiconductor stressor region.

The transistor can be configured such that: at least a portion of the second semiconductor region is doped more heavily than the first semiconductor region, or such that: at least a portion of the second semiconductor region has a conductivity being one of n-type or p-type conductivity which is opposite a conductivity of the first semiconductor region where the at least a portion of the second semiconductor region and the first semiconductor region meet.

Another aspect of the invention provides a method of fabricating a transistor on a substrate. Such method can include: forming a gate overlying a channel region, the channel region having a plurality of fins each having an apex extending in a first direction parallel to a major surface of the substrate. Each fin may extend in a second direction downwardly away from the apex thereof. In such case, the gate may overlie the apexes and extend downwardly between adjacent fins of the channel region.

Such method can further include forming a semiconductor stressor region extending in at least the first direction away from the fins. The semiconductor stressor region can be configured to apply a stress to the channel region. In one example, the semiconductor stressor region may include a first semiconductor region and a second semiconductor region overlying the first semiconductor region. A source region and a drain region can be formed which are separated from one another in the first direction by the channel region. At least one of the source region or the drain region may be disposed at least partly within the semiconductor stressor region.

The method can be performed to produce a transistor configured such that: at least a portion of the second semiconductor region is doped more heavily than the first semiconductor region, or such that: at least a portion of the second semiconductor region has a conductivity being one of n-type or p-type conductivity which is opposite a conductivity of the first semiconductor region where the at least a portion of the second semiconductor region and the first semiconductor region meet.

BRIEF DESCRIPTION OF THE DRAWINGS

FIGS. 3A, 3B and 3C are cross-sectional views through lines A-A, B-B, and C-C of FIG. 2, respectively, further illustrating the finFET depicted in FIG. 2;

FIGS. 8A, 8B and 8C are cross-sectional views corresponding to the views through lines A-A, B-B, and C-C of FIG. 2, respectively, illustrating another stage in a method of fabricating a finFET according to an embodiment of the invention;

FIGS. 9A, 9B and 9C are cross-sectional views corresponding to the views through lines A-A, B-B, and C-C of FIG. 2, respectively, illustrating another stage in a method of fabricating a finFET according to an embodiment of the invention;

FIG. 9D is an enlarged cross-sectional view further illustrating detail shown in FIG. 9C.

FIGS. 10A, 10B and 10C are cross-sectional views through lines A-A, B-B, and C-C of FIG. 2, respectively, further illustrating a finFET according to a variation of the embodiment depicted in FIGS. 3A, 3B and 3C.

FIGS. 11A, 11B and 11C are cross-sectional views corresponding to the views through lines A-A, B-B, and C-C of FIG. 2, respectively, illustrating a stage in a method of fabricating a finFET as seen in FIGS. 10A-10C;

DETAILED DESCRIPTION

Figures 1, 2:
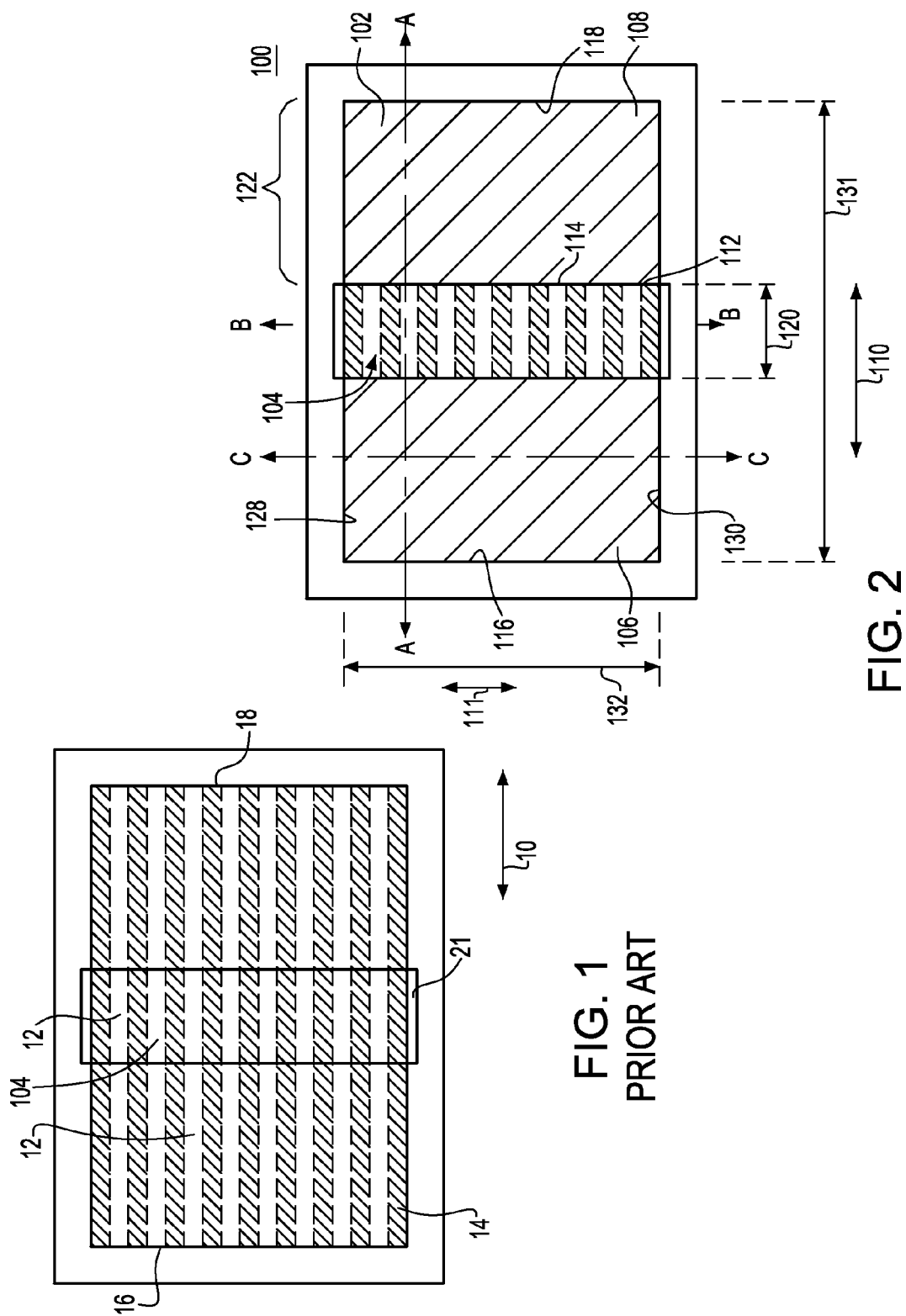
FIG. 1 is a sectional view illustrating the structure of a transistor (e.g., a finFET) according to the prior art.
FIG. 2 is a plan view from above a major surface of a substrate of a finFET according to an embodiment of the invention.

FIG. 2 is a plan view from above a finFET 100 according to an embodiment of the invention and FIGS. 3A, 3B and 3C are corresponding cross-sectional views through lines A-A, B-B, and C-C of FIG. 2, respectively. As seen in FIG. 2, an active semiconductor region 102 can accommodate a channel region 104 of a finFET, a source region 106 and a drain region 108, the source and drain regions 106, 108 being separated by the channel region 104 in a first direction 110 parallel to a major surface of the substrate. The channel region includes a plurality of fins 112 which extend in the first direction 110.

FIGS. 3A, 3B and 3C further illustrate an exemplary structure of the finFET 100. As seen in FIGS. 3A and 3B, the fins 112 have apexes which extend in the first direction 110 generally parallel to the major surface 115 of the substrate. Each fin also extends in a second direction 117 downwardly away from the apex 113 of the fin. A gate 121 overlies the apexes 113 and extends downwardly between adjacent fins 112, e.g., as seen in troughs 123 between adjacent fins 112. The gate 121 typically is separated from the fins 112 by an insulating gate dielectric layer 125. With the gate overlying opposite surfaces of each fin of the channel region, better control over conduction of the field effect transistor can be achieved relative to a planar transistor in which the gate overlies only one surface of the channel region. In this way, it may be possible to achieve better short channel control.

A semiconductor stressor region 122 (shown by hatched portions of the active semiconductor region 102 in FIG. 2) can extend in at least the first direction 110 away from the fins in a portion of the active semiconductor region in which at least one of the source region 106 or the drain region 108 may also be at least partially disposed. Referring to FIGS. 3A and 3C, the semiconductor stressor region 122 can have a lattice constant which is different from the lattice constant of the semiconductor region 124 on which it is disposed and from which the fins of the channel region are typically made. The semiconductor stressor region 122 can be formed by epitaxial growth on the underlying semiconductor region 124. The lattice constant refers to the constant distance between unit cells in a crystal lattice of the semiconductor material therein. The difference in the lattice constants between the semiconductor stressor region 122 and the semiconductor region on which it is grown introduces a strain therein which permits the semiconductor stressor region 122 to apply a stress to the channel region. In turn, the stress can increase the performance of the finFET such as its on-current and switching speed.

As seen in FIG. 2 and FIG. 3B, dielectric regions which can be isolation trenches 114 separate portions of adjacent fins 112 from one another. The gate 121 overlies upper portions 142 of the fins 112 which extend in the second direction, i.e., downward direction 117 from the apexes 113. The dielectric regions, e.g., isolation trenches 114 can be disposed between lower portions 144 of adjacent fins. Thus, the gate 121 can overlie the dielectric regions, e.g., isolation trenches 114 between respective adjacent fins 112. In an example, and without limitation to the many finFET devices which can be implemented in accordance with the invention, the dielectric regions 114 and the lower portions 144 of the fins 112 may have a dimension 146 in the second direction 117 of 50-60 nanometers, and the upper portions 142 of the fins 112 may have a dimension 148 in the second direction 117 of 20-30 nanometers extending above the dielectric regions 114.

Unlike the structure discussed above relative to FIG. 1, the isolation trenches 114 do not extend to first and second peripheral edges 116, 118 of the active semiconductor region which are opposite one another in the first direction 110. Rather, referring to FIG. 2, the extent of the isolation trenches may be limited to a dimension 120 in the first direction 110 of the active semiconductor region which is also occupied by the channel region 104. Thus, it is possible for the isolation trenches 114 to not extend in direction 110 throughout the dimensions in which the source region 106 and the drain region 108 extend. Moreover, it is possible for the isolation trenches 114 to not be present within the source region 106 and the drain region 108.

A possible advantage of such configuration is apparent from FIGS. 2 and 3A, 3B and 3C. As seen in FIG. 2, isolation trenches 114 of dimension 120 in direction 110 separate adjacent fins 112 of the device from one another. However, the isolation trenches 114 are not present or at least not generally present in direction 110 between the channel region and the peripheral edges 116, 118 of the active semiconductor region. Such configuration allows the semiconductor stressor region 122 to be provided atop portions of an underlying, e.g., bulk semiconductor region 124 of the substrate in such way that a boundary 126 of the semiconductor stressor region with the underlying or bulk semiconductor region 124 is continuous in a direction 111 parallel to line C-C of FIG. 2 over a distance spanning a plurality of the fins 112. The semiconductor stressor region 122 may be continuous throughout the entire dimension 132 of the active semiconductor region between third and fourth peripheral edges 128, 130 of the active semiconductor region 102. Providing a semiconductor stressor region which is continuous in a direction 111 over such distance may permit the semiconductor stressor region to more effectively apply a stress to the channel region. The semiconductor stressor region may also be continuous in direction 110 over the distance 131 from peripheral edge 116 to opposite peripheral edge 118 of the active semiconductor region, except for the channel region 104 which occupies a portion of the active semiconductor region 102 between the peripheral edges 116, 118. In one example, the continuity of the interface between the semiconductor stressor region and the underlying semiconductor region can help to apply a greater stress to the channel region, such as which can be used to increase the performance of the finFET (e.g., its on-current, switching speed, etc.) by at least a factor of two above that of the transistor depicted in FIG. 1. Referring to FIG. 3C, a surface 126 of the bulk semiconductor region on which the semiconductor stressor region is disposed may be substantially flat. However, in a particular example as depicted in FIG. 3C, there may be some residual surface topography, such as a plurality of parallel troughs 138 extending in the first direction 110 (FIG. 2, 3A). While the surface topography, if any, can be less than a few nanometers in depth, in one example, the surface topography such as parallel troughs may have a depth 140 in the second direction 117 (FIG. 3B) which is greater than one nanometer but typically a few nanometers or less. The parallel troughs may be a result of processing used to form and remove the fins of the finFET from an area beyond the channel region, as will be further described below.

Typically, the semiconductor stressor region 122 and the underlying or bulk semiconductor region 124 on which it is disposed and of which the fins 112 are provided consist essentially of monocrystalline semiconductor material. For example, the underlying or bulk semiconductor region 124 can be made of monocrystalline semiconductor material such as a bulk semiconductor region of a monocrystalline semiconductor substrate, e.g., a silicon substrate. One or both of the semiconductor stressor region 122 and the underlying semiconductor region can be made of, or can include a monocrystalline semiconductor material such as silicon (Si) or germanium (Ge). In one example, the semiconductor stressor region may be formed by deposition onto the underlying semiconductor region. The semiconductor stressor region 122 may epitaxially grow from an exposed surface of the underlying semiconductor region 124. In one example, the underlying semiconductor region 124 can consist essentially of silicon and the semiconductor stressor region can consist essentially of a semiconductor alloy of silicon with another semiconductor such as germanium or carbon. In another example, the underlying semiconductor region can consist essentially of a semiconductor alloy material including silicon and the semiconductor stressor region can consist essentially of a semiconductor material such as silicon. In yet another example, both the underlying semiconductor region and the semiconductor stressor region can consist essentially of a semiconductor alloy material including silicon but the percentages of the alloying material, e.g., the percentage of Ge or carbon (C) in the semiconductor alloy, in the underlying semiconductor region 124 and in the semiconductor stressor region 122 can vary.

In still other examples, the semiconductor region 124 can be made of or can include a III-V monocrystalline semiconductor material which is a compound of an element selected from the Group III elements of the periodic table with another element selected from the Group V elements of the periodic table, such as GaAs or InP, for example. In one example, the semiconductor stressor region can include a semiconductor alloy material thereof. In yet another example, the semiconductor region 124 can be made of or can include a II-VI monocrystalline semiconductor material which is a compound of an element selected from the Group II elements of the periodic table with another element selected from the Group VI elements of the periodic table. In one example, the semiconductor stressor region can include a semiconductor alloy material thereof.

As further seen in FIGS. 3A and 3C, the semiconductor stressor region 122 can have a first semiconductor region 134 or layer contacting the underlying semiconductor region 124 and a second semiconductor region 136 or layer overlying the first semiconductor region 134 and extending from the first semiconductor region, such that the second semiconductor region 136 can be layered on the first semiconductor region. In one example, the first and second semiconductor regions can have opposite n-type or p-type conductivities at locations where the first and second semiconductor regions meet. Thus, in one example, the transistor can be a p-type channel finFET of the enhancement type which is normally off unless an adequate bias voltage is applied to the gate. In such example, a predominant dopant concentration of electron donors in the channel region (e.g., an arsenic dopant or phosphorus dopant in silicon) may provide n-type conductivity and the first semiconductor region 134 or layer may also have n-type conductivity. In such example, a predominant dopant concentration of hole donors in the second semiconductor region 136 or layer (e.g., a boron dopant in silicon) can then provide p-type conductivity therein, which is opposite the conductivity of the first semiconductor region 134.

In another example, when the transistor is an n-type channel finFET of the enhancement type, the channel region 104 can have a predominant dopant concentration which gives the channel region p-type conductivity under no applied gate bias and the first semiconductor region 134 or layer may also have p-type conductivity. In such example, the second semiconductor region 136 or layer can then have n-type conductivity, which is opposite the conductivity type of the first semiconductor region 134.

In addition to the semiconductor stressor region having regions or layers with different n-type and p-type conductivities, the second semiconductor region can be more heavily doped than the first semiconductor region. Typically, the dopant concentration of the second semiconductor layer is one or more orders of magnitude greater than the dopant concentration of the first semiconductor layer. Thus, in one example, the first semiconductor layer 134 can have a concentration of the predominant dopant ranging from $1 \times 10^{18}$ $cm^{-3}$ to $1 \times 10^{19}$ $cm^{-3}$ and the second semiconductor layer 136 can have a concentration of the predominant dopant that ranges from $1 \times 10^{20}$ $cm^{-3}$ and above. In a specific example, in the p-type enhancement finFET described above, the concentration of the n-type dopant in the first semiconductor layer 134 can range from $1 \times 10^{18}$ $cm^{-3}$ to $1 \times 10^{19}$ $cm^{-3}$ and the concentration of the p-type dopant in the second semiconductor layer 136 can range from $1 \times 10^{20}$ $cm^{-3}$ and above.

In another example, it is possible for the first and second semiconductor regions 134, 136 or layers to have the same n-type or p-type conductivity, but for the second semiconductor region to be more heavily doped than the first semiconductor region, at dopant concentrations such as those described above. Thus, when the transistor is a p-type finFET of the enhancement type such as described above, the channel region of the transistor can be doped n-type such that it has n-type conductivity under no applied gate bias. In such example, each of the first and the second semiconductor regions 134, 136 of the semiconductor stressor region can be doped to have p-type conductivity under no applied gate bias.

Figure 4A:
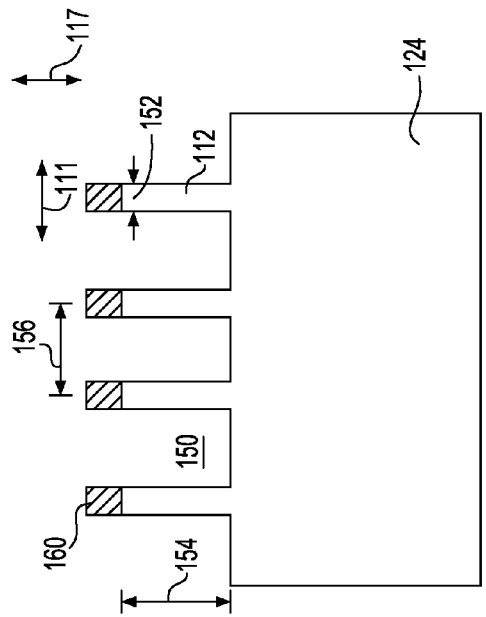
FIGS. 4A and 4B are cross-sectional views corresponding to the views through lines A-A and B-B of FIG. 2, respectively, illustrating a stage in a method of fabricating a finFET according to an embodiment of the invention.
Figure 4B:
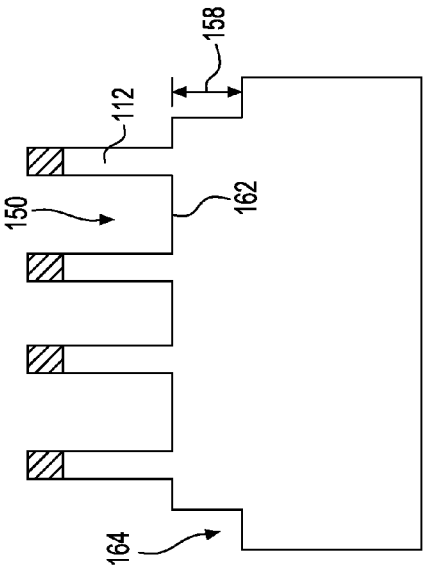

Having described an example of a finFET 100 according to an embodiment of the invention, a method of making a finFET will now be described. In each of the figures referenced in the process description below which are labeled with the "A" suffix, such as "FIG. 4A", correspond to a view along section line A-A of FIG. 2, while each figure referenced in the process description below which is labeled with the "B" suffix, such as "FIG. 4B", corresponds to a view along section line B-B of FIG. 2, and each figure referenced in the process description below which is labeled with the "C" suffix, such as "FIG. 8C", corresponds to a view along section line C-C of FIG. 2. Referring to FIGS. 4A and 4B, a stage of processing is shown in which a monocrystalline semiconductor region 124 of a substrate such as a bulk semiconductor region is patterned to form a plurality of fins 112 extending in a second direction 117 of the substrate, with grooves 150 formed between respective adjacent fins. For example, the semiconductor region can be patterned by anisotropic etching using a hard mask 160 overlying portions of the substrate which will remain after etching to become fins 112. In one example, when the semiconductor region 124 is or includes silicon, the hard mask can include a layer of silicon oxide adjacent the semiconductor region and a layer of silicon nitride overlying the silicon oxide. As a result of this processing, the fins 112 (FIG. 4B) can be patterned throughout an area which encompasses the active semiconductor region 102 shown in FIG. 2. FIG. 4A illustrates that the hard mask 160 protects the semiconductor region from being patterned such that a fin 112 extends throughout semiconductor region in direction 110 along a line corresponding to line A-A of FIG. 2.

In one example, a thickness 152 of each fin 112 in a direction 111 can be less than 20 nanometers and may be less than 15 nanometers. In one example, a height 154 of the fins 112 in direction 117 can be 70 to 80 nanometers. A pitch 156 between fins 112 can be 30-50 nanometers.

Figure 5A:
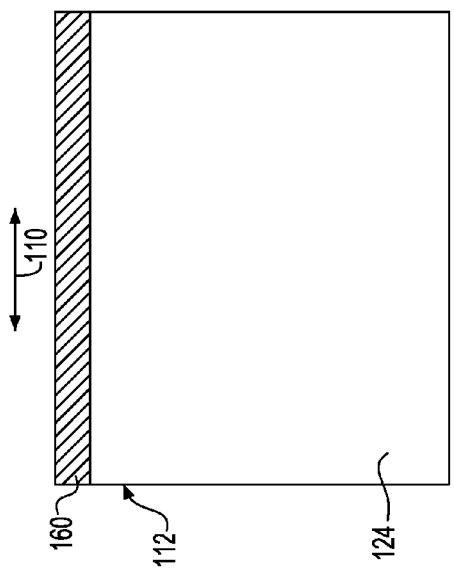
FIGS. 5A and 5B are cross-sectional views corresponding to the views through lines A-A and B-B of FIG. 2, respectively, illustrating another stage in a method of fabricating a finFET according to an embodiment of the invention.
Figure 5B:
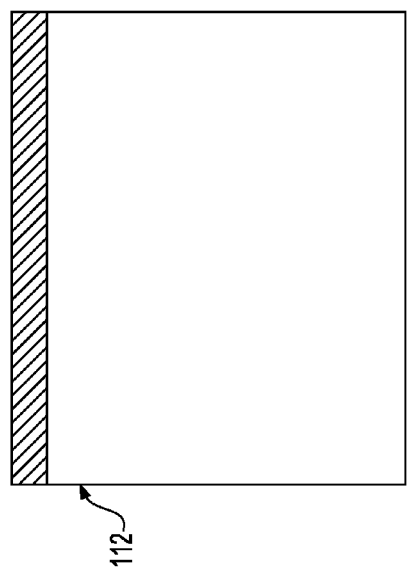

FIGS. 5A and 5B further illustrate that trenches 164 can be etched in the semiconductor region at edges of the active semiconductor region. In one embodiment, the trenches can reach a depth 158 ranging from 50 to 200 nanometers below the bottoms 162 of the grooves 150 between the fins 112. The trenches can define the peripheral edges of the active semiconductor region 102 in directions 110, 111 as shown in FIG. 2.

Figure 6A:
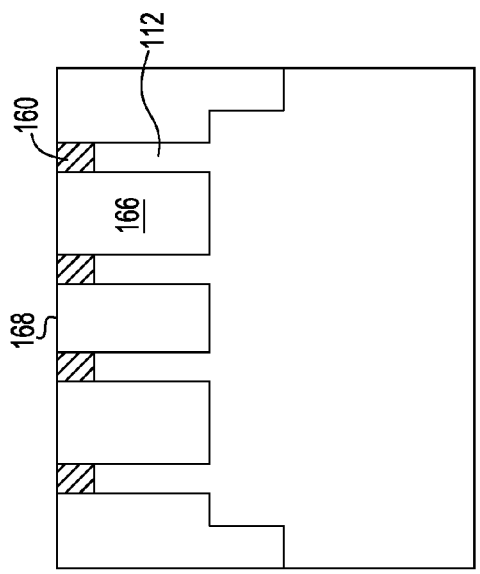
FIGS. 6A and 6B are cross-sectional views corresponding to the views through lines A-A and B-B of FIG. 2, respectively, illustrating another stage in a method of fabricating a finFET according to an embodiment of the invention.
Figure 6B:
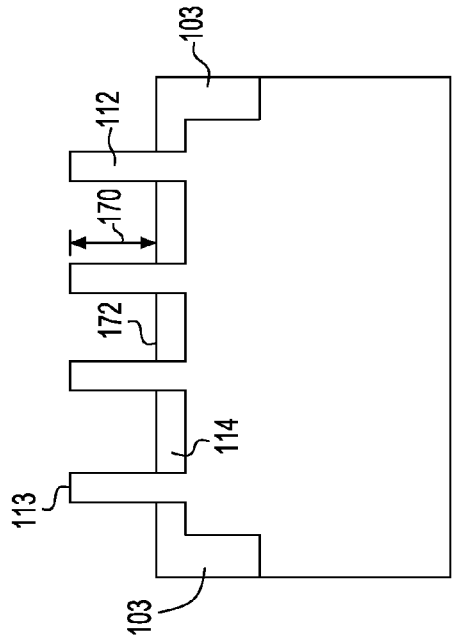

As shown in FIGS. 6A and 6B, a dielectric material can then be deposited into the grooves 150 and trenches and then planarized to form a structure as shown having dielectric regions 166 disposed between respective adjacent fins 112, and in which the hard mask 160 may be exposed at a major surface 168 defined by surfaces of the dielectric regions and the hard mask. In one example, the dielectric material can be deposited by a high density plasma oxide deposition process.

Figure 7A:
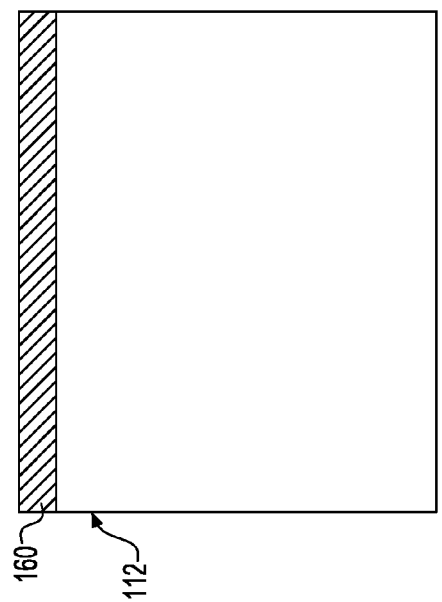
FIGS. 7A and 7B are cross-sectional views corresponding to the views through lines A-A and B-B of FIG. 2, respectively, illustrating another stage in a method of fabricating a finFET according to an embodiment of the invention.
Figure 7B:
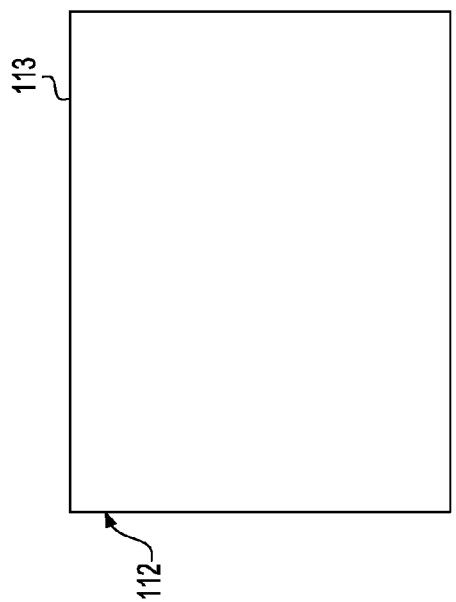

As shown in FIGS. 7A and 7B, an etching process can be applied to recess the dielectric regions to a depth corresponding to a desired height for the upper portions of the fins 112 so as to form the isolation trenches 114, and to form peripheral dielectric isolation trenches 103 at a periphery of the active semiconductor region. Such etching process can be performed by anisotropic etching of the dielectric material of the dielectric regions 114, in a manner so as to selectively preserve material of the hard mask 160 and protect the fins 112 from being recessed at that time. As a result, a height 170 of the fins 112 projecting above upwardly facing surfaces 172 of the isolation trenches 114 to apexes 113 of the fins 112 can be 20 to 30 nanometers. The hard mask 160 can be removed to expose the apexes 113 of the fins as shown in FIG. 7A or 7B to form a tri-gate finFET in which the gate is configured to operate at each of the downwardly extending surfaces of the fins 112 as well as the apexes 113, as further shown in FIGS. 3A-3C. Alternatively, in a finFET according to a variation of the embodiment seen in FIGS. 3A-3C, the hard mask 160 can be preserved at this stage to form a double-gate finFET in which the gate is configured to operate at the downwardly extending surfaces of the fins 112 but which is not configured to operate at the apexes 113 of the fins.

As shown in FIGS. 8A-8C, a gate dielectric 125 and a gate 121 are formed overlying the apexes 113 and the downwardly extending surfaces of the upper portions 142 of the fins 112. Dielectric spacers 174 can be formed on sidewalls of the gate 121 which define a dimension 120 of the gate 121 in direction 110. As seen in FIG. 8C, at this stage of processing, the fins can be exposed above the isolation trenches at locations along line C-C of FIG. 2, and other locations which are disposed beyond the sidewall spacers and the gate (the gate and sidewall spacers being not visible in the view seen in FIG. 8C.

As seen in FIGS. 9A, 9B and 9C, portions of the fins 112 extending beyond the sidewall spacers 174 on the gate can then be removed, such as by an anisotropic etch process performed so as to selectively preserve the dielectric material of the sidewall spacers 174 and dielectric regions such as isolation trenches 114 and the peripheral dielectric isolation regions 103 or trenches. The fins can be etched in portions of the active semiconductor region 102 (FIG. 2) disposed beyond the channel region 104 such that the semiconductor material is etched to the same depth or to about the same depth as the isolation trenches to form troughs 138 between adjacent isolation trenches 114. However, as seen in the enlarged view of FIG. 9D, the troughs 138 may extend below a depth of the isolation trenches 114 or may extend to depths above the depth of the isolation trenches 114.

Thereafter, referring again to FIGS. 2 and 3A-C, portions of the isolation trenches 114 disposed beyond the gate 121 can be selectively removed so as to preserve the underlying semiconductor region 124, such as by selective etching. Then, a semiconductor stressor region 122 can be formed atop the underlying semiconductor region 124. For example, a semiconductor material or semiconductor alloy material can be deposited to form the semiconductor stressor region 122 as described above, having a first semiconductor region 134 or layer and a second semiconductor region 136 or layer, with characteristics as described above. In one example, the first semiconductor region 134 can be formed by epitaxially growing a layer of semiconductor alloy material on the bulk semiconductor region 124, and the second semiconductor region 136 can be formed on the first semiconductor region 134 by epitaxial growth. Thus, in one example, when the finFET is an enhancement type p-channel type FET, the first and second semiconductor regions can be formed by epitaxially growing layers of silicon germanium, for example.

One or more drain extensions, or halo regions and a source region and a drain region can be formed at respective portions of the active semiconductor region at adjacent to or at one or more boundaries of the gate 121. At least one of the source region or drain region, or both the source and the drain region can be at least partly disposed in the semiconductor stressor region 122. One or more of these regions may be formed at least partly by in situ doping of the semiconductor material when epitaxially growing the semiconductor stressor region 122, or by ion implantation, or by both. The first and second semiconductor regions can be formed to have the dopant concentrations and conductivities as described above relative to FIGS. 2 and 3A-C. Thus, at the conclusion of processing, a finFET is formed having a structure as described above relative to FIGS. 2 and 3A-C.

FIGS. 10A, 10B and 10C are sectional views through lines A-A, B-B, and C-C of FIG. 2, illustrating a finFET according to a variation of the embodiment shown in FIGS. 3A-3C. As seen in FIG. 10B, in this example, the peripheral dielectric isolation regions 203 or trenches extend to the same depth as the dielectric isolation trenches 214 which are disposed between adjacent fins 212 of the finFET. FIGS. 10A and 10C further illustrate that the semiconductor stressor region 222 and the peripheral dielectric isolation regions 203 can be disposed atop an essentially flat major surface of the underlying semiconductor region 124.

A method of fabricating a finFET will now be described according to a variation of the embodiment described above. FIGS. 11A, 11B and 11C illustrate a stage of fabrication corresponding to that of FIGS. 8A, 8B and 8C, after the gate 221 has been formed, but before the fins 212 and isolation trenches 214 have been removed from areas beyond the channel region. As shown therein, in this example, at this stage of processing, the peripheral isolation trenches 203 at the periphery of the active semiconductor region 202 can have a dimension 246 in second direction 117 in which the fins 212 extend which is the same as the dimension 248 in the second direction 117 of the isolation trenches 214 which are disposed between respective adjacent fins 212. Such configuration enables the peripheral isolation trenches 203 to be formed by the same etching and deposition processes which forms the isolation trenches 214, such that the above-described step of separately patterning areas 164 (FIG. 5B) of the active semiconductor region for forming the peripheral isolation trenches 103 (FIGS. 2 and 3A-C) can be eliminated. FIGS. 10A-C illustrate a stage of processing after the isolation trenches 214 and peripheral isolation trenches 203 have been formed, after which the gate 221 can be formed.

Figure 12B:
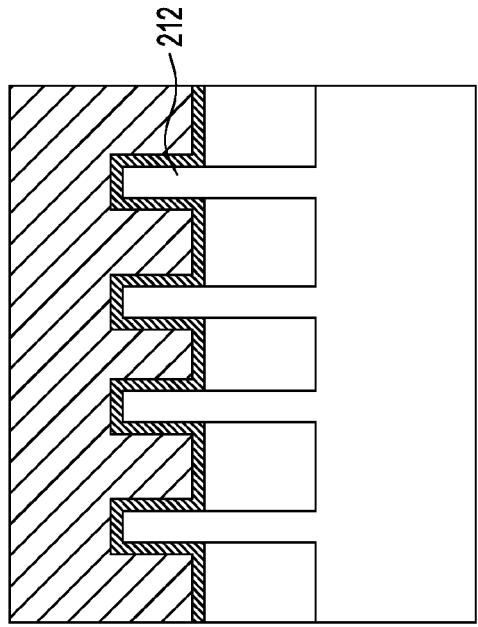
FIGS. 12A, 12B, 12C are cross-sectional views corresponding to the views through lines A-A, B-B, and C-C of FIG. 2, respectively, illustrating another stage in a method of fabricating a finFET as seen in FIGS. 10A-10C.
Figure 12C:
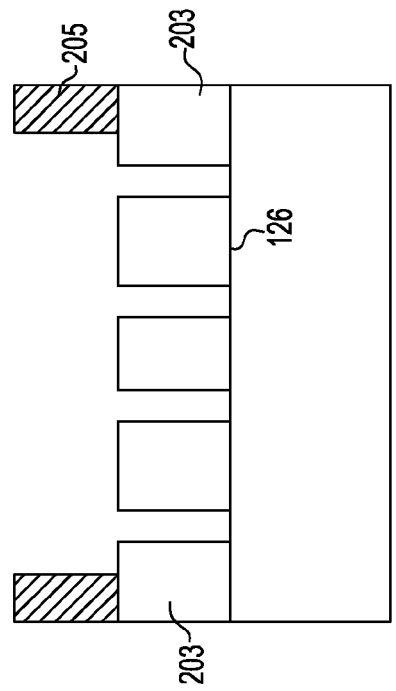
Figure 12A:
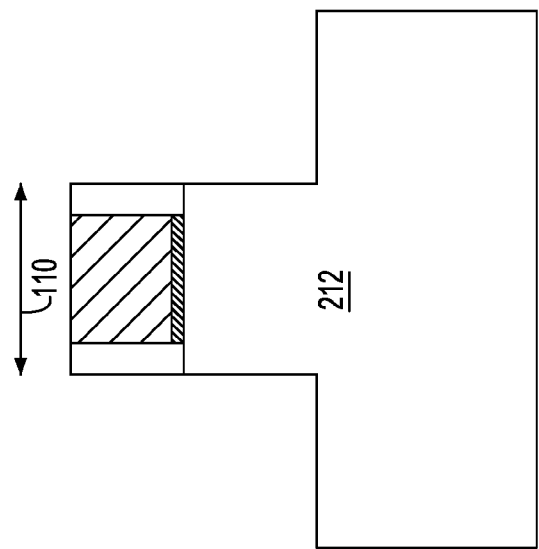

Thereafter, as seen in FIGS. 12A, 12B and 12C, the fins 212 can be recessed in the areas of the active semiconductor region beyond the channel region, such as by etching the semiconductor material of the fins 212 selectively relative to other materials which are present, such as the dielectric material of the isolation trenches 214 and peripheral isolation trenches 203. During the recessing step, a hard mask 205 can be used to protect portions of the peripheral isolation trenches 203 from eroding beyond a tolerable extent.

Figure 13A:
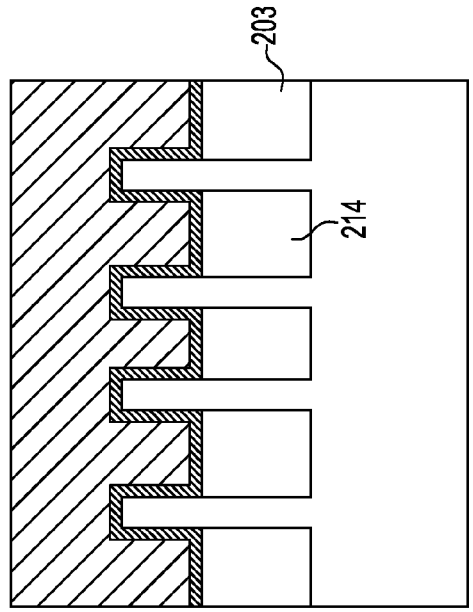
FIGS. 13A, 13B, 13C are cross-sectional views corresponding to the views through lines A-A, B-B, and C-C of FIG. 2, respectively, illustrating another stage in a method of fabricating a finFET as seen in FIGS. 10A-10C.
Figure 13B:
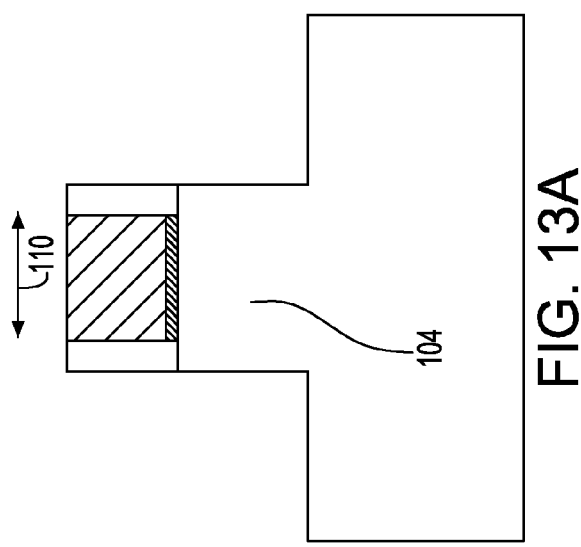
Figure 13C:
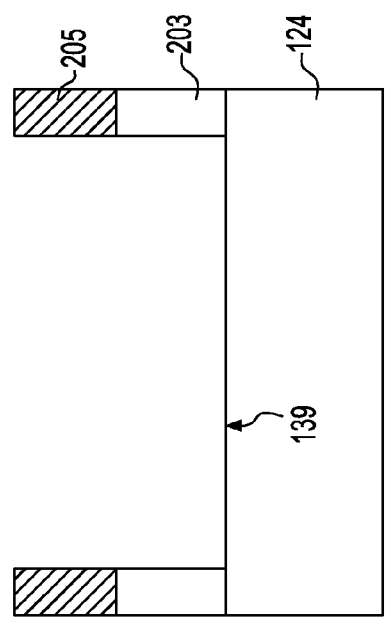

Thereafter, as seen in FIGS. 13A, 13B and 13C, the hard mask 205 can protect the peripheral isolation trenches 203 from eroding beyond a tolerable limit when the isolation trenches 214 are removed from the structure in areas beyond the channel region. Again, as seen in FIG. 13C, although in one example, the semiconductor region 124 can be substantially flat in areas beyond the channel region where the fins 212 have been removed, some surface topography such as a plurality of parallel features may remain which extend in direction 110 of FIG. 13A.

Subsequently, as seen in FIGS. 10A, 10B and 10C, the semiconductor stressor region 222 can be formed on one or more areas of the underlying semiconductor region 124 located between opposed peripheral isolation trenches 203. For example, the semiconductor stressor region 222 can be formed as first and second semiconductor regions in like manner as the process described above relative to FIGS. 3A, 3B and 3C for forming the semiconductor stressor region 122. Like that of FIGS. 3A-3C described above, the semiconductor stressor region 222 may have a first semiconductor region deposited, e.g., grown, on an underlying semiconductor region by epitaxy and a second semiconductor region formed, e.g., deposited such as epitaxially grown atop the first semiconductor region.

The foregoing descriptions of embodiments of the invention are illustrative. It will be appreciated that the features of the embodiments of the invention described above can be combined in ways other than those which are specifically described above. In addition, while the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A method of fabricating a transistor on a substrate having an active semiconductor region, the method comprising:
    forming a gate overlying a channel region, the channel region having a plurality of fins each having an apex extending in a first direction parallel to a major surface of the substrate, and each fin extending in a second direction downwardly away from the apex thereof, such that the gate overlies the apexes and extends downwardly between adjacent fins of the channel region;
    forming a plurality of dielectric regions, each dielectric region extending in the first direction and disposed between lower portions of respective adjacent fins;
    forming a semiconductor stressor region extending in at least the first direction away from the fins and being configured to apply a stress to the channel region, the semiconductor stressor region including a first semiconductor region atop an underlying semiconductor region of the substrate and a second semiconductor region overlying and extending from the first semiconductor region; and
    forming a source region and a drain region separated from one another in the first direction by the channel region, at least one of the source region or the drain region disposed at least partly within the semiconductor stressor region;
    wherein the plurality of dielectric regions do not extend to a first peripheral edge of the active semiconductor region in the first direction.

2. The method as claimed in claim 1, wherein the step of forming the plurality of dielectric regions comprises extending in the first direction in at least one area beyond the channel region and recessing portions of the fins in the at least one area, and then depositing a semiconductor alloy material on the underlying semiconductor region in the at least one area, the semiconductor alloy material having a lattice constant different from the lattice constant of the underlying semiconductor region.

3. The method as claimed in claim 2, wherein the step of forming the semiconductor stressor region includes depositing the semiconductor alloy material, wherein a percentage of the another semiconductor material in the semiconductor stressor region varies relative to a percentage of the another semiconductor material in the bulk semiconductor region of the substrate.

4. The method as claimed in claim 2, wherein the bulk semiconductor region consists essentially of silicon and the semiconductor stressor region includes an alloy of silicon with at least one of germanium or carbon.

5. The method as claimed in claim 1, wherein the step of forming the semiconductor stressor region includes doping the second semiconductor region more heavily than the first semiconductor region and the second semiconductor region has a dopant concentration of at least $1 \times 10^{20}$ cm$^{-3}$.

6. The method as claimed in claim 1, wherein the fins have upper portions extending in the second direction from the apexes, and lower portions extending in the second direction from the upper portions, and the gate overlies the upper portions of the fins, the transistor further comprising dielectric regions disposed between the lower portions of respective adjacent fins of the plurality of fins, wherein the gate overlies the dielectric regions between the fins.

7. The method as claimed in claim 1, wherein the at least a portion of the second semiconductor region has a conductivity being one of n-type or p-type which is opposite the conductivity of the first semiconductor region.

8. The method as claimed in claim 1, wherein the transistor comprises a p-channel type transistor and the conductivities of the first and second semiconductor regions comprise n-type and p-type, respectively.

9. The method as claimed in claim 1 wherein:
    a boundary of the semiconductor stressor region with the bulk semiconductor region is continuous in a third direction parallel to the major surface of the substrate and transverse to the first direction; and the boundary is further continuous in the third direction over a distance spanning the plurality of fins.

10. The method as claimed in claim 1, wherein the semiconductor stressor region extends in the first direction from the first peripheral edge to a the second peripheral edge, wherein the extension of the semiconductor stressor region is continuous except for the channel region.

11. The method as claimed in claim 1, further comprising:
an entire extent of the dielectric regions being limited to a dimension in the first direction which is also occupied by the channel region, wherein the dielectric regions do not extend into the source region and do not extend into the drain region.

12. The method as claimed in claim 1 wherein the at least one of the source region or the drain region is disposed at least partly within the semiconductor stressor region by doping.

13. The method as claimed in claim 1 wherein the at least one of the source region or the drain region is disposed at least partly within the semiconductor stressor region by ion implantation.

14. The method as claimed in claim 1 wherein the plurality of dielectric regions do not extend to a second peripheral edge of the active semiconductor region in the first direction.

15. The method as claimed in claim 14, wherein:
the channel region extends in the third direction from a third peripheral edge of the active semiconductor region to a fourth peripheral edge of the active semiconductor region; and
the semiconductor stressor region is continuous throughout an entire dimension of the active semiconductor region between the third and fourth peripheral edges of the active semiconductor region;
wherein an interface between the semiconductor stressor region and the bulk semiconductor region in the dimension of the active semiconductor region is continuous.

16. The method as claimed in claim 14 wherein the plurality of dielectric regions do not extend from the channel region to the first peripheral edge of the active semiconductor region in the first direction.

17. The method as claimed in claim 16 wherein the plurality of dielectric regions do not extend from the channel region to the second peripheral edge of the active semiconductor region in the first direction.

18. A method of forming a transistor on a substrate, the method comprising:
forming a channel region disposed within a bulk semiconductor region of the semiconductor substrate and having a plurality of fins, each fin having an apex extending in a first direction parallel to a major surface of the substrate, and each fin extending in a second direction downwardly away from the apex thereof;
forming a semiconductor stressor region extending in at least the first direction away from the fins and being configured to apply a stress to the channel region, the semiconductor stressor region including a first semiconductor region and a second semiconductor region overlying and extending from the first semiconductor region;
forming a source region and a drain region separated from one another in the first direction by the channel region, at least one of the source region or the drain region disposed at least partly within the semiconductor stressor region;
forming a plurality of dielectric regions, each dielectric region disposed between lower portions of respective adjacent fins, an extent of the dielectric regions being limited to a dimension in the first direction which is also occupied by the channel region but not occupied by the source region or the drain region; and
forming a gate overlying the apexes and extending downwardly between adjacent fins of the channel region and overlying the dielectric regions between the respective adjacent fins.

* * * * *